HIGH-VOLTAGE SEMICONDUCTOR DEVICE HAVING A GUARD RING CONTAINING SUBSTITUTIONALLY ACTIVE IONS IN INTERSTITIAL POSITIONS

Filed Oct. 16, 1967 2 Sheets-Sheet 1

INVENTOR
FREDERICK W. MARTIN
STANLEY HARRISON
BY Francis J. Thornton
ATTORNEY

HIGH-VOLTAGE SEMICONDUCTOR DEVICE HAVING A GUARD RING CONTAINING SUBSTITUTIONALLY ACTIVE IONS IN INTERSTITIAL POSITIONS

Filed Oct. 16, 1967 2 Sheets-Sheet 2

INVENTOR
FREDERICK W. MARTIN
STANLEY HARRISON
BY Francis J. Thornton
ATTORNEY

United States Patent Office 3,515,956

Patented June 2, 1970

3,515,956

HIGH-VOLTAGE SEMICONDUCTOR DEVICE HAVING A GUARD RING CONTAINING SUBSTITUTIONALLY ACTIVE IONS IN INTERSTITIAL POSITIONS

Frederick W. Martin, Braband, Denmark, and Stanley Harrison, Bedford, Mass., assignors to Ion Physics Corporation, Burlington, Mass., a corporation of Delaware Filed Oct. 16, 1967, Ser. No. 675,519

Int. Cl. H01l 7/54, 9/00

U.S. Cl. 317—234 1 Claim

ABSTRACT OF THE DISCLOSURE

A process for treating a semiconductor device to control the surface charge on semiconductor bodies thereby reducing the leakage current and increasing the effective breakdown voltage of the device which comprises the irradiation of the device with a sufficient number of ions of a selected type and energy to implant the substitutionally active ions beneath the surface of the device in interstitial positions and create carrier trapping centers and thereby change the surface resistance of the device. This irradiation is concentrated in a small area surrounding the active P-N junction of the device to create a guard ring around the junction and to prevent the creation of inversion states or accumulation layers on the surface of the device thereby controlling the amount of mobile carriers in the semiconductor surface layers and to reduce the leakage current and increase the effective breakdown voltage of the device.

BACKGROUND OF THE INVENTION

This invention relates generally to semiconductor devices and more particularly to semiconductor devices having controlled improved electrical properties.

It has long been known in the semiconductor art that one of the factors which prevents devices from realizing their predicted performance is electrical surface charge. This charge may be in states which are present at the surface of the crystal itself or may possibly represent ions on the outside of the naturally occurring surface oxide layer. Variations in the amount of surface charge have been reduced by intentionally depositing an additional layer of material such as silicon dioxide on the surface of the device.

Surface charges of either sign attract mobile carriers, that is, holes or electrons, of the opposite sign thereby altering the carrier density in a thin region beneath the surface of the semiconductor crystal. If the induced carriers are of the same type as those in the bulk of the crystal a so-called accumulation layer is created, which acts as a surface skin of low resistivity. If the induced carriers are of opposite sign to those in the bulk there will result either a surface region depleted of carriers or a so-called inversion layer, which although of opposite conductivity type than the bulk also acts as a surface skin of low resistivity.

In general these low-resistance surface layers are responsible for the leakage current of semiconductor P-N junction diodes. In a typical asymmetrically doped diode, in which the depletion region is nearly all on one side of the junction, it is commonly known that an inversion layer over the depleted semiconductor causes large leakage currents at voltages well below the breakdown voltage of the diode. In such a case the inversion layer is called a channel. It also appears that accumulation layers over the depleted semiconductor control the magnitude of leakage currents above the breakdown voltage of the diode.

The present invention is directed toward control of the amount of mobile carriers in semiconductor surface layers, in order to obtain layers of accurately specified resistivity, and to reduce the leakage current and increase the effective breakdown voltage of semiconductor diodes.

SUMMARY OF THE INVENTION

Broadly speaking these features and advantages are obtained in the present invention by placing beneath the surface of the semiconductor body being treated and beneath any insulating surface films which may be present a suitable number of implanted ions. This implantation increases to a high value the resistivity of any inversion or accumulation layers which are present.

BRIEF DESCRIPTION OF THE DRAWINGS

All the novel features of the present invention will be more fully understood and appreciated by examples given in the following description taken in conjunction with the accompanying drawings, wherein.

DESCRIPTION OF THE PREFERRED EMBODIMENT

Figure 1:
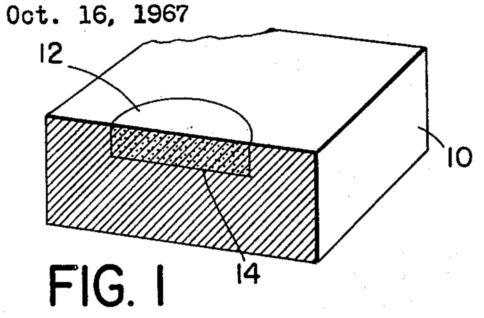
FIG. 1 shows a P-N junction to be treated by the described invention.
Figure 2:
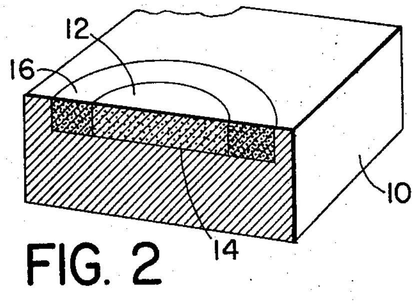
FIG. 2 illustrates the same device after treatment in accordance with the present invention.

With reference now to the drawings and more particularly to FIG. 1, there is shown a sample, semiconductor body 10, composed of 9,000 ohm-centimeter N-type silicon having a 0.01 ohm-centimeter P-type region 12 formed therein. The method by which region 12 is formed in the device body 10 is well known to one skilled in the art and may for example be diffusion or ion implantation. The devices described here were formed by ion implantation through a 1000 angstrom thick silicon oxide passivating layer (not shown in the figures). A P-N junction 14 separates region 12 from the main body 10. By providing suitable leads (not shown) to the P region 12 and the body 10 respectively a voltage source (not shown) may be applied to the device such that the P-N junction 14 is reversed biased. As is well known, such reverse biasing creates a depletion or space charge region which extends further into the N-type body 10 than into the heavily doped P-type region 12.

Figure 3:
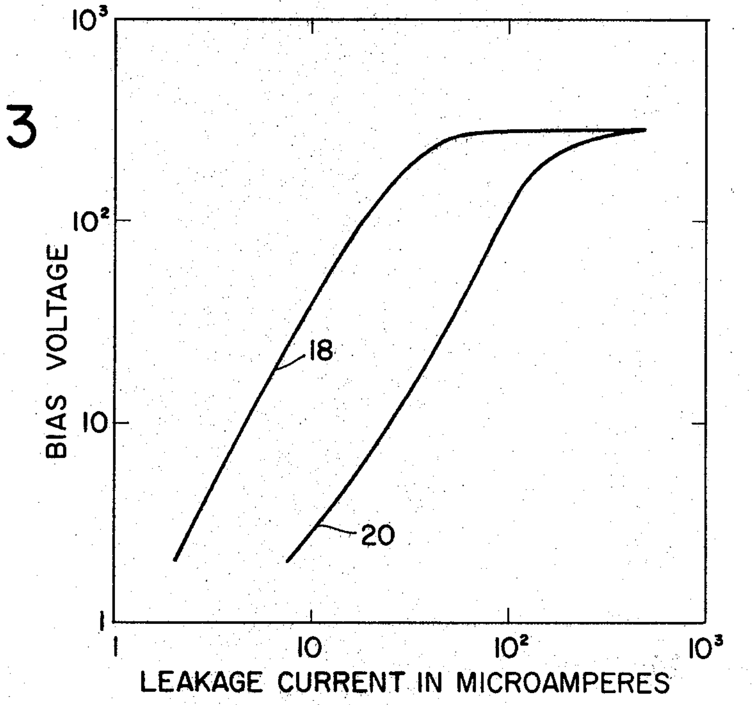
FIG. 3 illustrates the voltage-current characteristics of a device prior to and after treatment in accordance with the invention.

The reverse voltage-current characteristic of this particular device prior to treatment in accordance with this invention is shown as curve 20 of FIG. 3. It can be seen that this device at 100 volts exhibits leakage current of about 100 microamperes. In this instance the magnitude of the leakage current and the shape of the curve indicate that the surface was inverted. In other words a P-type channel existed over the surface of the N-region.

In accordance with the invention the leakage currents were markedly improved in the described device by the formation of a ring of implanted material around the region 12. The ring was created by irradiation of the diode with energetic boron ions. More specifically the device was masked and placed in the beam of an appropriate ion accelerator and irradiated only in the area of ring 16 with 100 kilovolt boron ions. An ion beam was directed onto the device which had a current and cross sectional area sufficient to implant $10^{12}$ ions per square centimeter in ring 16 during the time of irradiation. Definition of the ring 16 was accomplished by the utilization of standard photo-resist masking techniques over previously treated region 12 and that portion of the body 10 which was not to have ions implanted therein. The photoresist material was sufficiently thick that no ion could penetrate through it into either the silicon or the silicon oxide passivating film. Ions of 100 kilovolt energy were used since it was calculated that they would penetrate through the oxide film and into the silicon of region 16 to a depth approximate to the level of junction 14.

Curve 18 of FIG. 3 shows the effect of the implantation of resistance ring 16 in the described device. As may be noted the formation of ring 16 reduced the leakage current by a factor of 5, while the breakdown voltage remained approximately 300 volts, the same as before treatment. This change in characteristic is believed to be due to the fact that the ring produced a high resistance in the surface leakage path between the P-type region 12 and the N-type bulk of body 10, which both shortened the length of the surface channel and decreased the surface leakage current.

Figure 4:
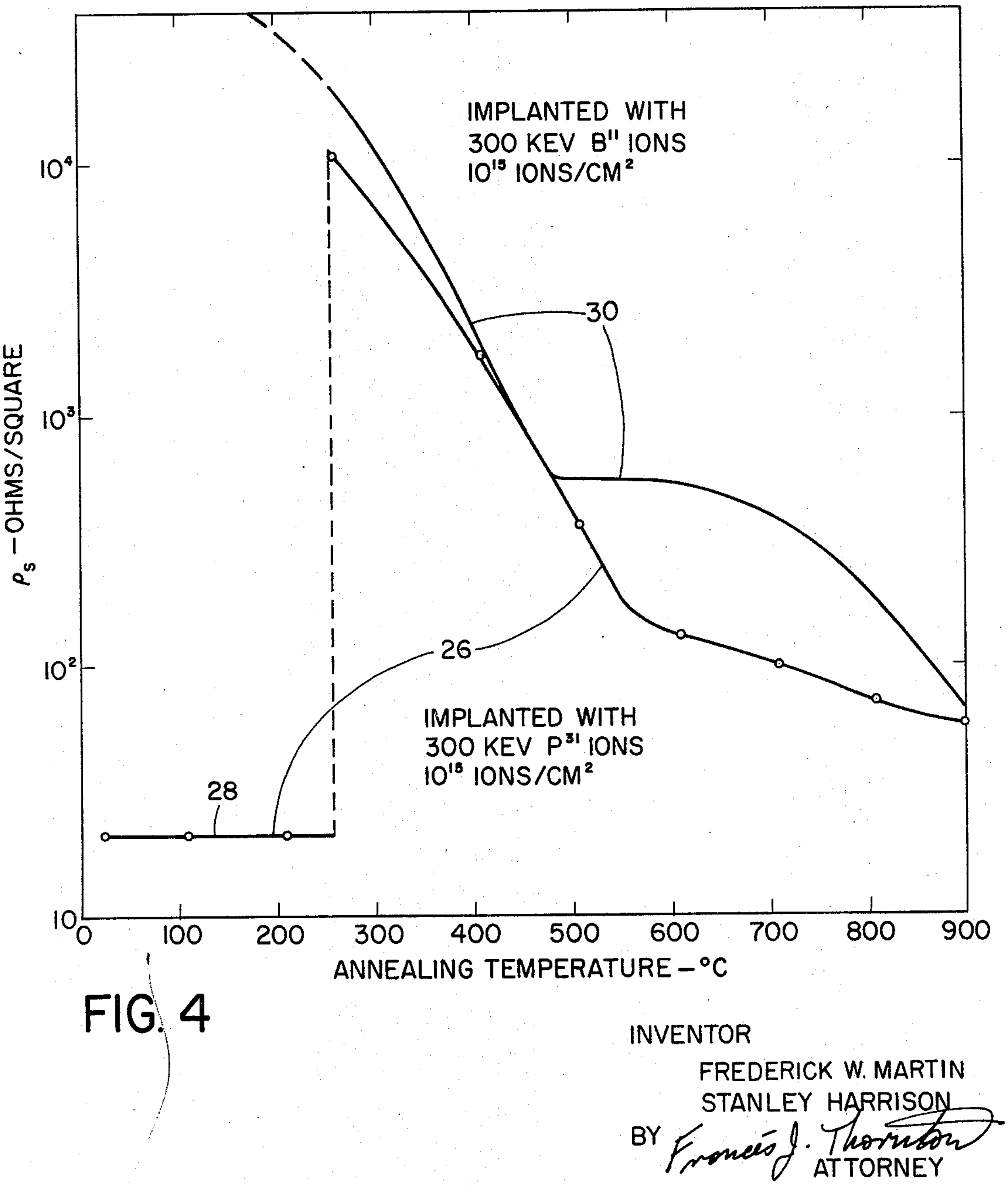
FIG. 4 illustrates the effect of temperature on the sheet resistance of the implanted layer.

The large magnitude of the surface resistance is shown by the measurements presented in FIG. 4. These measurements in general were taken on surface layers of opposite conductivity type than the bulk, made by ion implantation of dopant ions in silicon. Because of the opposite type, the surface layers were separated from the bulk by a depletion region, and measurements of the surface resistance of the layers in ohms per square were possible. Curve 30 illustrates the surface resistance as a function of annealing temperature for N-type silicon implanted with 300 kilovolt boron ions to a density of $10^{15}$ per square centimeter. It is noted that this curve shows the result of heating the sample at various annealing temperatures from below 200° C. to above 900° C. Each heating of the sample at a specified temperature to arrive at this curve required approximately 1 hour at each selected temperature. The progressive decrease of resistance illustrated by this curve is due to a combination of increased numbers of holes available as the implanted boron ions move to substitutional lattice positions and to decreased trapping of these holes as radiation-induced trapping centers are removed. These trapping centers are created by the implantation of the ions in the semiconductor lattice and are, in essence, vacancy-interstitial pairs created by the mechanism by which the ions stop in the lattice. These defects or trapping centers cause high surface resistance. Annealing of the irradiated body not only moves the implanted ions into substitutional positions but also eradicates these trapping centers or recombination points by permitting the lattice to heal itself. It is to be noted that the unannealed layer has a resistance near $10^5$ ohms per square. Other data indicate that irradiation using $10^{13}$ to $10^{14}$ boron ions per square centimeter produces layers with sheet resistance from $10^6$ to $10^7$ ohms per square.

Curve 26 illustrates the surface resistance as a function of annealing temperature of P-type silicon implanted with $10^{15}$ phosphorous ions per square centimeter. In this case introduction of the ions does not immediately produce an N-type layer as expected. The surface remains P-type up to 250° C., as indicated by measurement of a resistance appropriate to the bulk sample in the flat portion 28 of curve 26. With a P-type layer which is not separated from the bulk by a depletion region, current can flow through the surface resistance and bulk resistance in parallel, and the measured value is the low bulk resistance. Curve 28 accordingly does not provide information about the surface resistance, which may well be as large as that for unannealed boron. At approximately 250° C. the surface layer changes to N-type and the surface resistivity can be measured as about $10^4$ ohms per square. Above 250° C. the resistance decreases progressively as the temperature is raised.

Figure 5:
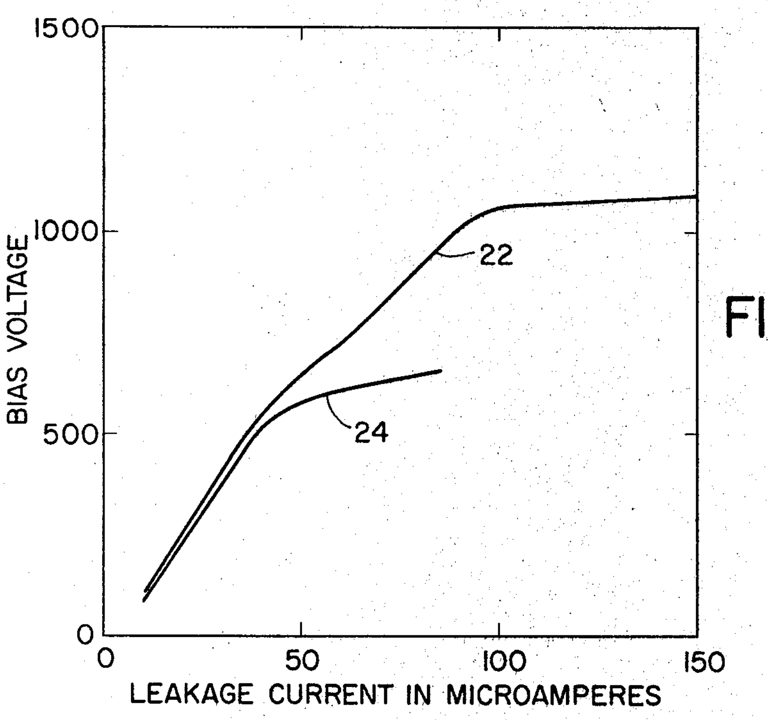
FIG. 5 illustrates the voltage-current characteristics of a different device before and after irradiation.

The example presented above and in FIG. 3 was one in which the surface contained an inversion layer. The described process may also be utilized with devices having accumulation layers on the surface thereof. Sample voltage-current characteristics of such a device both before and after irradiation are illustrated in FIG. 5, for which again a semiconductor body 10 is used, composed of 11,000 ohm-centimeter N-type silicon having a 0.01 ohm-centimeter P-type region 12 of 0.5 inch diameter and having a 1000 angstroms thick silicon oxide passivating layer. Curve 24 shows the leakage before irradiation. Because of the leakage of only 10 microamperes at 100 volts, as low as that of curve 18 after irradiation, it is inferred that the surface is not inverted. Curve 22 shows the leakage after an irradiation of $10^{12}$ boron ions per square centimeter of 100 kilovolt energy in the region 16. Below 500 volts the leakage is the same as before irradiation, but above 500 volts the leakage is much reduced and has an incremental resistance of 10 megohms, which suggests that the breakdown current flows through a surface layer whose resistance is increased by the irradiation. By this means the effective breakdown voltage of the device is raised from 600 to 1100 volts, as shown in FIG. 5.

It is thus obvious from the described examples that the invention can be used to treat both inversion layers and accumulation layers on the surface of devices.

An advantage of surface implantation as described is that the surface properties of finished devices may be altered after all other stages of fabrication. For example, an integrated circuit containing many transistors and circuit elements may be irradiated such that there is formed a resistance ring around certain elements in order to obtain the desired situation. Because the implantation process can be performed at room temperature, this can be effected without harm to the finished device structure. That is it can be accomplished without diffusion of the dopant atoms in region 12 and without degradation of carrier lifetimes because of diffusion of unwanted impurities from the surface of the device. It may also be performed without removing any passivating coatings which exist on such devices as well as in the absence of such coatings.

Having now described several embodiments of the present invention it should become apparent to those skilled in the art that many modifications of the present invention can be made. For example the concentration of ions implanted below the surface of device body 10 may be modified over many decades of concentration, and the resulting mobile charge may be adjusted over many decades by heating. Other ions than boron may be used, including such dopant ions as phosphorus, nitrogen, aluminum, and indium, as well as non-dopant ions such as hydrogen, helium, oxygen, and neon. Additionally semiconductor materials other than silicon may be used such as germanium, silicon carbide, other so-called Group IV compounds, so-called Group III–V compounds, and so-called Group II–VI compounds. Additionally since the invention can obviously be used for integrated circuits and transistors as well as for diodes, it is intended that the invention not be limited to diodes but be extended to all semiconductor devices which may have their characteristics improved by the above-described treatment. Having now described the invention and modifications thereof it is respectfully requested that the invention be limited only by the accompanying claims.

What is claimed is:

1. A passivated semiconductor device comprising a body of semiconductor material having a planar surface and containing conductivity determining impurities of a first type, a passivation layer on said surface, current carrying layers on said surface beneath said passivation layer, a region in said body containing conductivity determining impurities of a second type, the interface of said region with said body defining a P-N junction which has a substantially planar portion parallel to said surface, said junction intersecting said surface, and a ring surrounding the intersection of said junction with said surface and extending into said body to a depth approximate to the level of said planar portion of said junction, said ring containing substitutionally active implanted ions in interstitial positions, trapping centers formed therein by said implantation and a selected surface resistance value between the intersection of said junction with said surface and the remainder of the surface of said device to reduce the current carrying capabilities of said layers.

References Cited

UNITED STATES PATENTS

| | | | |
|---|---|---|---|
| 3,390,019 | 6/1968 | Manchester | 148—1.5 |
| 3,293,084 | 12/1966 | McCaldin | 148—1.5 |
| 3,226,614 | 12/1965 | Hoenichen | 317—234 |
| 3,328,210 | 6/1967 | McCaldin | 148—1.5 |
| 3,341,754 | 9/1967 | Kellett | 317—234 |

JOHN HUCKERT, Primary Examiner

M. H. EDLOW, Assistant Examiner

U.S. Cl. X.R.

148—1.5, 33; 317—235